US011978795B2

(12) United States Patent
Yu et al.

(10) Patent No.: US 11,978,795 B2
(45) Date of Patent: May 7, 2024

(54) SEMICONDUCTOR DEVICE INCLUDING RECESS GATE STRUCTURE AND METHOD OF MANUFACTURING THE SAME

(71) Applicants: SK hynix Inc., Gyeonggi-do (KR); Korea University Research and Business Foundation, Seoul (KR)

(72) Inventors: Hyun-Yong Yu, Seoul (KR); Seung Geun Jung, Seoul (KR); Mu Yeong Son, Seoul (KR)

(73) Assignees: SK hynix Inc., Gyeonggi-do (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 88 days.

(21) Appl. No.: 17/480,293

(22) Filed: Sep. 21, 2021

(65) Prior Publication Data
US 2022/0093795 A1    Mar. 24, 2022

(30) Foreign Application Priority Data
Sep. 22, 2020 (KR) .................. 10-2020-0122171

(51) Int. Cl.
*H01L 27/108* (2006.01)
*H01L 21/8234* (2006.01)
(Continued)

(52) U.S. Cl.
CPC .. *H01L 29/7827* (2013.01); *H01L 21/823437* (2013.01); *H01L 29/0847* (2013.01); *H01L 29/36* (2013.01); *H01L 29/4236* (2013.01)

(58) Field of Classification Search
None
See application file for complete search history.

(56) References Cited

U.S. PATENT DOCUMENTS

2014/0061781 A1* 3/2014 Kim .................... H01L 29/4236
257/331
2014/0063934 A1* 3/2014 Oh ......................... H10B 12/34
365/182
(Continued)

FOREIGN PATENT DOCUMENTS

KR    1020090081615 A    7/2009
KR    1020090081615 A2 *  7/2009
(Continued)

*Primary Examiner* — Ali Naraghi
(74) *Attorney, Agent, or Firm* — IP & T GROUP LLP

(57) ABSTRACT

A semiconductor device and a method of manufacturing the same. The semiconductor device has a substrate in which recess regions are formed and semiconductor regions acting as a source region or a drain region is defined between the recess regions; a gate insulating layer disposed on an inner surface of each recess region; a recess gate disposed on the gate insulating layer in each recess region; an insulating capping layer disposed above the recess gate in each recess region; a metallic insertion layer disposed between a side surface of the recess gate and a side surface of the insulating capping layer and facing with a side surface of the source region or the drain region; and an intermediate insulating layer disposed between the metallic insertion layer and the recess gate to electrically insulate the metallic insertion layer from the recess gate.

12 Claims, 17 Drawing Sheets

(51) Int. Cl.
*H01L 29/08* (2006.01)
*H01L 29/36* (2006.01)
*H01L 29/423* (2006.01)
*H01L 29/78* (2006.01)

(56) References Cited

U.S. PATENT DOCUMENTS

| | | | |
|---|---|---|---|
| 2014/0264568 A1* | 9/2014 | Kim | H10B 12/34 |
| | | | 257/330 |
| 2016/0351702 A1* | 12/2016 | Numabe | H01L 29/0696 |
| 2017/0125422 A1* | 5/2017 | Kang | H01L 29/7813 |
| 2017/0186844 A1* | 6/2017 | Kim | H10B 12/053 |
| 2021/0104624 A1* | 4/2021 | Hsieh | H01L 29/7889 |
| 2021/0320008 A1* | 10/2021 | Kim | H01L 29/4236 |

FOREIGN PATENT DOCUMENTS

| | | |
|---|---|---|
| KR | 1020150090674 A | 8/2015 |
| KR | 1020160126147 A | 11/2016 |
| KR | 1020170141975 A | 12/2017 |

* cited by examiner

< S/D length 10 nm >

< S/D length 8 nm >

SEMICONDUCTOR DEVICE INCLUDING RECESS GATE STRUCTURE AND METHOD OF MANUFACTURING THE SAME

CROSS-REFERENCES TO RELATED APPLICATION

The present application claims the benefit of Korean application number 10-2020-0122171, filed on Sep. 22, 2020, which is herein incorporated by reference in its entirety.

BACKGROUND OF THE INVENTION

1. Field

The present invention relates to a semiconductor device and a method of manufacturing the same, and more particularly, to a semiconductor device having a recess gate structure and a method of manufacturing the same.

2. Description of the Related Art

The currently commercially available MOSFET (metal-oxide-semiconductor field-effect transistor) semiconductor device consists of a gate for forming a channel through which current can flow, and source/drain that transfer current through them. It has been used in various semiconductor products such as access memory and logic devices.

Recently, for high integration of semiconductor devices, in the case of a DRAM (dynamic random-access memory), a MOSFET in a core cell may employ a recess gate structure, which is a gate structure of a buried type in which a gate is embedded into silicon (Si) to overcome a short channel effect. However, even if the recess gate structure is applied, the process of forming the source and drain becomes progressively more difficult due to the continuous scaling down of these devices. There is a concern that external parasitic resistance increases because of the reduction of contact area with wiring structures, such as via or plug, for the outside connection of a source and a drain. Such a situation makes it difficult to scale down the devices.

In order to address the above-mentioned external parasitic resistance above, prior techniques have attempted to reduce contact resistance and improve on-state current performance by forming highly-doped sources and drains, but with reduced area of source and drain, the process for forming the source and drain is getting more and more difficult. Furthermore, if sources and drains are doped at high concentrations to reduce the above external parasitic resistance, there may be a limit in increasing the doped concentration due to solubility and diffusivity for a dopant of the silicon itself, and there is also a concern that high-concentration doping also may cause defects in the inter-device deviation and thereby require subsequent high temperature-heat treatment processing.

SUMMARY OF THE INVENTION

One technological object of the present invention is to provide a semiconductor device which may facilitate on-current characteristics by effectively increasing the effective doping concentration, i.e., virtual doping concentration even if a high concentration doping process is not applied to the semiconductor region, for example to a source/drain region, and includes a recess gate structure that can implement high integration with reduced variation between devices.

In addition, another technical object of the present invention is to provide a method of manufacturing a semiconductor device having the above-described recess gate structure.

The technological problems to be solved by the present invention is not limited to the problems as mentioned above, and other problems that are not mentioned will be understood by those skilled in the art from the following description.

According to one embodiment of the present invention, there is provided a semiconductor device comprising: a substrate having a plurality of recess regions and a plurality of semiconductor regions comprising a source region and a drain region defined between the plurality of recess regions; a gate insulating layer disposed on an inner surface of each of the plurality of recess regions; a recess gate disposed on the gate insulating layer in each of the plurality of recess regions; an insulating capping layer disposed above the recess gate in each of the plurality of recess regions; a metallic insertion layer disposed between a side surface of the gate insulating layer and a side surface of the insulating capping layer and facing a side surface of the source region or the drain region; and an intermediate insulating layer disposed between the metallic insertion layer and the recess gate to electrically insulate the metallic insertion layer from the recess gate.

In an embodiment, the metallic insertion layer may include another portion extending from a portion disposed between the side surface of the insulating capping layer and the side surface of the gate insulating layer to a bottom portion of the insulating capping layer and an upper portion of the intermediate insulating layer.

The metallic insertion layer may be configured to increase an effective doping concentration of the semiconductor region by changing an energy band of the source or the drain region.

The metallic insertion layer may be configured to increase on-current of the semiconductor device.

The plurality of recess regions may include a first recess region and a second recess region adjacent to each other, and the plurality of semiconductor regions may include a first semiconductor region disposed between the first and second recess regions, and a first metallic insertion layer may be provided in the first recess region. A second metallic insertion layer may be provided in the second recess region, and an energy band thereof may be changed over the entire region of the first semiconductor region clue to the first and second metallic insertion layers.

Each of the plurality of semiconductor regions may have a length of less than about 10 nm.

The plurality of semiconductor regions may be n-type semiconductor regions, and the metallic insertion layer may have a work function bottom than that of the n-type semiconductor region. The metallic insertion layer may include at least one element selected from Ti, TiN, Ta, TaN, Al, Zr, TiW, Er, $ErC_2$, and Gd.

The plurality of semiconductor regions may be p-type semiconductor regions, and the metallic insertion layer may have a work function higher a that of the p-type semiconductor region. The metallic insertion layer may include at least one element selected from Au, Pt, Pd, Ni, and Co.

The gate insulating layer may have a thickness of about 6.5 nm or less.

The plurality of recess regions may include a first recess region, a second recess region, and a third recess region, and the plurality of semiconductor regions may include a) a first semiconductor region disposed between the first and second recess regions and b) a second semiconductor region disposed between the second and third recess regions; and a first recess gate may be provided in the first recess region. A second recess gate may be provided in the second recess region, and a third recess gate may be provided in the third recess region. The first recess gate may be a passing gate. The second and third recess gates may be cell gates.

According to another embodiment of the present invention, there is provided a method of manufacturing a semiconductor device comprising: preparing a substrate having a plurality of recess regions formed thereon; forming a gate insulating layer on an inner surface of each of the plurality of recess regions; forming a recess gate disposed on the gate insulating layer in each of the plurality of recess regions; forming an intermediate insulating layer disposed on the recess gate in each of the plurality of recess regions; forming a metallic insertion layer disposed on the intermediate insulating layer in each of the plurality of recess regions; forming an insulating capping layer disposed on the metallic insertion layer in each of the plurality of recess regions; and forming a plurality of semiconductor regions comprising a source region and a drain region in a substrate region between the plurality of recess regions, and wherein the metallic insertion layer is provided so that it may be extended along a bottom surface and a side surface of the insulating capping layer, and the intermediate insulating layer is disposed between the metallic insertion layer and the recess gate.

The metallic insertion layer may be configured to increase the effective doping concentration of the semiconductor region by changing an energy band of the semiconductor region.

The metallic insertion layer may be configured to increase on-current of the semiconductor device.

The plurality of recess regions may include a first recess region and a second recess region adjacent to each other, and the plurality of semiconductor regions may include a first semiconductor region disposed between the first and second recess regions, and a first metallic insertion layer may be provided in the first recess region. A second metallic insertion layer may be provided in the second recess region, and an energy band thereof may be changed in the entire region of the first semiconductor region due to the first and second metallic insertion layers.

Each of the plurality of semiconductor regions may have a length of less than about 10 nm.

The plurality of semiconductor regions may be n-type semiconductor regions, and the metallic insertion layer may have a work function bottom than that of the n-type semiconductor region.

The plurality of semiconductor regions may be p-type semiconductor regions, and the metallic insertion layer may have a work function higher than that of the p-type semiconductor region.

The plurality of recess regions may include a first recess region, a second recess region, and a third recess region, and the plurality of semiconductor regions may include a first semiconductor region disposed between the first and second recess regions and a second semiconductor region disposed between the second and third recess regions; and a first recess gate may be provided in the first recess region. A second recess gate may be provided in the second recess region, a third recess gate may be provided in the third recess region, and the first recess gate may be a passing gate. The second and third recess gates may be cell gates.

According to various embodiments of the present invention, it is possible to realize a semiconductor device having a recessed gate structure wherein the on-current characteristics and the like may be improved by effectively increasing an effective doping concentration, that is, a virtual doping concentration even if a high concentration doping process is not applied to the semiconductor region. In particular, it is possible to implement a semiconductor device having a recessed gate structure wherein the effective doping concentration, i.e., the virtual doping concentration of the semiconductor region may be increased by changing the energy band of the semiconductor region (source/drain region) by using the charge-plasma effect.

According to various embodiments of the present invention, it is possible to overcome the limitations of the high concentration doping process of the source/drain through the charge-plasma effect, to increase the conduction current, i.e., on-state current of the device, and at the same time, to obtain excellent performance even at a low doping concentration. In this regard, it is possible to reduce/alleviate variations between devices which are generated due to intra-wafer processes such as random dopant fluctuation (RDF). Accordingly, the technology according to various embodiments of the present invention may be a technology capable of overcoming the limitation of device miniaturization due to an increase in the process difficulties of the source and drain. In addition, when the technology according to various embodiments of the present invention is used, it is possible to implement a semiconductor device capable of maintaining operational characteristics even at a low applied voltage through an increase in conduction current.

DETAILED DESCRIPTION OF THE INVENTION

Figure 1:
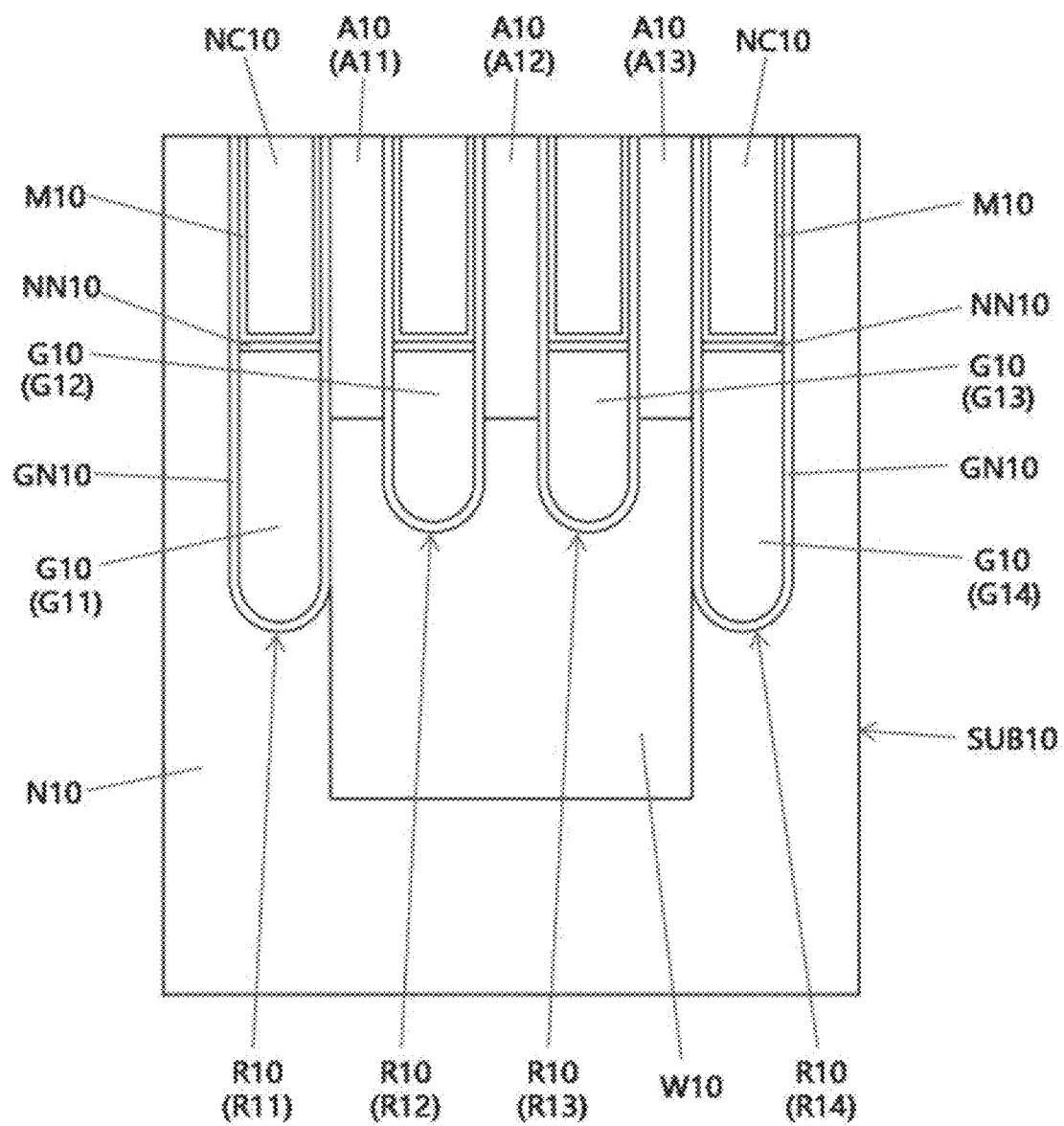
FIG. 1 is a cross-sectional diagram illustrating a semiconductor device having a recess gate structure according to an embodiment of the present invention.

Hereinafter, exemplary embodiments of the present invention will be described in detail with reference to the accompanying drawings.

The embodiments of the present invention to be described below are provided to more clearly describe the present invention to those having a common knowledge in the related art, and the scope of the present invention is not limited by the following embodiments, and the following embodiments may be modified in many different forms.

The terminology used herein is used to describe a specific embodiment and is not intended to limit the present invention. As used herein, a singular form may include plural forms unless the context clearly indicates otherwise. Also, as used herein, the term such as "comprise" and/or "comprising" specifies the mentioned shapes, numbers, steps, actions, members, elements and/or the presence of these groups, and does not exclude the presence or addition of one or more other shapes, numbers, actions, members, elements and/or presence or addition of groups. In addition, the terminology "connection" used in the present specification means not only those certain members are directly connected, but also includes indirect connection configured by further interposing other members between the members.

In addition, in the present specification when a member is positioned "on" another member, this includes not only the case where the member is in contact with the other member, but also the case where another member exists between the two members. The term "and/or" as used herein includes any one, and all combinations of one or more of the corresponding listed items. In addition, as used herein, terms such as "about", "substantially" and the like are used as a range of numerical values or degrees or a meaning close thereto, in consideration of inherent manufacturing and material tolerances, and are provided to aid understanding of the present application. Accurate or absolute numerical values are provided to aid in the understanding of this application.

Hereinafter, various embodiments of the present invention will be described in detail with reference to the accompanying drawings. The size or the thickness of regions or parts shown in the accompanying drawings may be somewhat exaggerated for clarity of the specification and convenience of description. The same reference numerals denote the same elements throughout the detailed description.

FIG. 1 is a cross-sectional diagram illustrating a semiconductor device having a recess gate structure according to an embodiment of the present invention.

Referring to FIG. 1, the semiconductor device according to an embodiment may include a substrate SUB10. A plurality of recess regions R10 may be formed on the substrate SUB10. The plurality recess regions R10 may be regions recessed froth are upper surface of the substrate SUB10. A plurality of semiconductor regions A10 acting as sources/drains may be defined between the plurality of recess regions R10. The plurality of semiconductor regions A10 may be considered as a part of the substrate SUB10. The plurality of semiconductor regions A10 may be a region doped with impurities, that is, an impurity region (a doped region). An insulating region N10 may be provided on the substrate SUB10, and a well region W10 may also be provided. The insulating region N10 may be provided to define the well region W10, and a plurality of semiconductor regions A10 may be provided on the well region W10. The well region W10 may be a semiconductor region doped with a predetermined impurity. For example, the well region W10 may be a region doped with a p-type impurity, and in this case, the plurality of semiconductor regions A10 may be a region doped with an n-type impurity. Alternatively, the well region W10 may be a region doped with an n-type impurity. In this case, the plurality of semiconductor regions A10 may be a region doped with a p-type impurity. The well region W10 and the plurality of semiconductor regions A10 may include, for example, Si. The insulating region N10 may include, for example, $SiO_2$ or other insulating materials. The insulating region N10 may have a Shallow Trench Insulator (STI) structure for device isolation. The substrate SUB10 may be a substrate of IV group such as silicon, and silicon/germanium, or may be a compound substrate of III-V group or II-VI group as a non-limiting example. Alternatively, it may be a semiconductor substrate having a stacked structure such as a silicon-on-insulator (SOI) for suppressing a body effect.

There may be provided the gate insulating layer GN10 on an inner surface including a lateral side and a bottom side each of the plurality of recessed regions 110. The gate insulating layer GN10 may include, for example, $SiO_2$, or may include another insulating material such as a high-k material to replace the $SiO_2$. A material that may be used as a gate insulating material in a general transistor device may be applied as a material of the gate insulating layer GN10. The gate insulating layer GN10 having a thin thickness may be substantially conformity formed along the inner surface of the recess region R10. A recess gate G10 may be provided on the gate insulating layer GN10 in each of the plurality of recess regions R10. The recess gate G10 may be provided to fill a bottom region of the recess region R10. The recess gate G10 may be formed of a predetermined conductive material. The recess gate G10 may be referred to as a recess gate electrode.

An insulating capping layer NC10 may be provided above the recess gate G10 in each of the plurality of recess regions R10. The insulating capping layer NC10 may be provided in an upper region of the recess region R10. The insulating capping layer NC10 may be formed of, for example, $Si_xN_y$, e.g., $Si_3N_4$. However, the material of the insulating capping layer NC10 may be variously changed.

A metallic insertion layer M10 may be provided between the recess gate G10 and the insulating capping layer NC10 in each of the plurality of recess regions R10. The metallic insertion layer M10 may be disposed between a side surface of the insulating capping layer NC10 and a side surface of the gate insulating layer GN10. In another embodiment, as shown in FIG. 1, the metallic insertion layer M10 may be extended from a portion between the side surface of the insulating capping layer NC10 and the side surface of the gate insulating layer GN10, so that it may extend to a bottom portion of the insulating capping layer NC10 and extend to an upper portion of the intermediate insulating layer NN10 to be described later.

The metallic insertion layer M10 may be formed of a metal or a metallic material. The metallic insertion layer M10 may be formed to have a relatively thin thickness, for example, a thickness of about 20 nm or less or a thickness of about 10 nm or less.

An intermediate insulating layer NN10 which is arranged between the metallic insertion layer M10 and the recess gate G10 may be provided in each of the plurality of recess regions R10. Therefore, without being electrically connected to the recess gate G10, the metallic insertion layer M10 may be insulated from the recess gate G10. The metallic insertion layer M10 may be electrically floating. The intermediate insulating layer NN10 may be formed of, for example, $Si_xN_y$, e.g., $Si_3N_4$, but may be formed of another insulating material. The material of the intermediate insulating layer NN10 may be the same as the material of the insulating capping layer NC10, but may be different.

The plurality of recess regions R10 may include, for example, a first recess region R11, a second recess region R12, a third recess region R13, and a fourth recess region R14 that are spaced apart from each other. The first recess region R11 may be provided in the insulating region N10 on one side of the well region W10, and the fourth recess region R14 may be provided in the insulating region N10 on the other side of the well region W10. Each of the first and fourth recess regions R11 and R14 may be disposed to be in contact with or close to the well region W10. The second and third recess regions R12 and R13 may be provided to be inserted into the well region W10 between the first and fourth recess regions R11 and R14. The depths of the first and fourth recess regions R11 and R14 may be deeper than the depths of the second and third recess regions R12 and R13. Here, the numbering order of the first to fourth recess regions R11 to R14 is exemplary and may vary.

The plurality of semiconductor regions A10 may include a first semiconductor region A11 disposed between the first and second recess regions R11 and R12, a second semiconductor region A12 disposed between the second and third recess regions R12 and R13, and a third semiconductor region A13 disposed between the third and fourth recess regions R13 and R14. The first semiconductor region A11 may be a first source region, the second semiconductor region A12 may be a drain region or common drain region, and the third semiconductor region A13 may be a second source region.

The recess gate G10 disposed in the first recess region R11 may be referred to as a first recess gate G11, the recess gate G10 disposed in the second recess region R12 may be referred to as a second recess gate G12, the recess gate G10 disposed in the third recess region R13 may be referred to as a third recess gate G13, and the recess gate G10 disposed in the fourth recess region R14 may be referred to as a fourth recess gate G14. Here, the first and fourth recess gates G11 and G14 may be passing gates, and the second and third recess gates G12 and G13 may be cell gates.

In one embodiment of the present invention, the metallic insertion layer M10 may change the energy band structure of the semiconductor region A10, which is a source or drain region facing adjacent to the metallic insertion layer M10, and it also may be configured to increase an effective doping concentration, i.e., a virtual doping concentration of the semiconductor region A10. The metallic insertion layer M10 plays a role in increasing the effective doping concentration of the semiconductor region A10 adjacent thereto, that is, the virtual doping concentration by changing the energy band and using a charge-plasma effect. Thus, the on-current of the semiconductor device may be effectively increased by the metallic insertion layer M10. The role and function of the metallic insertion layer M10 will be described in more detail later with reference to FIGS. 4 and 5.

When the plurality of semiconductor regions A10 are n-type semiconductor regions, the metallic insertion layer M10 may have a work function lower than that of the n-type semiconductor region. In this case, the increase of the doping concentration of the semiconductor region due to the metallic insertion layer M10 may be more prominent than if no metallic insertion layer M10 were used. In this case, the metallic insertion layer M10 may include, for example, at least one from Ti, TiN, Ta, TaN, Al, Zr, TiW, Er, $ErC_2$, and Gd. The work function of Er or $ErC_2$ may be about 3.9 eV, the work function of Ti may be about 4.33 eV, and the work function of TiN may be about 4.5 eV. In one embodiment of the present invention, the work function of any metal higher than 3.4 eV can be used when the length of the semiconductor region A10, i.e., source/drain region, becomes small. When the plurality of semiconductor regions A10 are n-type semiconductor regions, the semiconductor device of FIG. 1 may be referred to as an n-type MOSFET device.

When the plurality of semiconductor regions A10 are p-type semiconductor regions, the metallic insertion layer M10 may have a work function higher than that of the p-type semiconductor region. In this case, an effect of increase in the doping concentration of the semiconductor region A10 by the metallic insertion layer M10 may be more prominent than if no metallic insertion layer M10 were used. At this tire, the metallic insertion layer M10 may include, for example, at least one from Au, Pt, Pd, Ni, and Co. When the plurality of semiconductor regions A10 are p-type semiconductor regions, the semiconductor device of FIG. 1 may be referred to as a p-type MOSFET device.

Here the specific materials presented as the material of the metallic insertion layer M10 are exemplary, and other materials such as metallic oxide or doped polysilicon may be applied as the material of the metallic insertion layer M10. In the case of doped polysilicon, the work function may be adjusted by changing the doping concentration of the doped polysilicon.

Additionally, the plurality of semiconductor regions A10 may be recessed by a predetermined thickness in the depth direction. In this case, the height of an upper surface of the semiconductor region A10 may be lower than the height of an upper surface of the insulating capping layer NC10. In addition, a part of the upper side of the gate insulating layer GN10 may be exposed.

Figure 2:
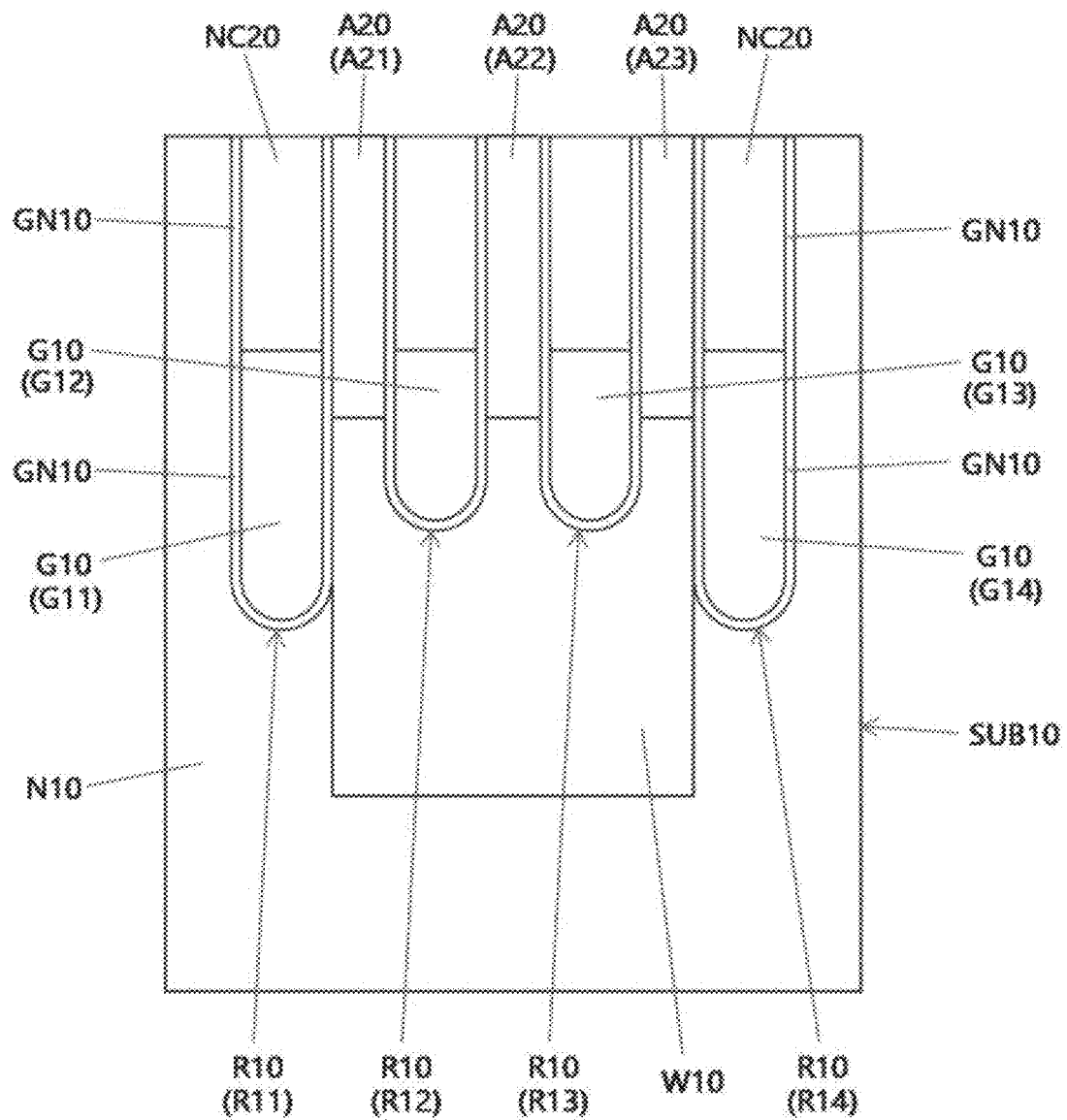
FIG. 2 is a cross-sectional diagram illustrating a semiconductor device having a recess gate structure according to a comparative example.

FIG. 2 is a cross-sectional diagram illustrating a semiconductor device having a recess gate structure according to a comparative example.

Referring to FIG. 2, the semiconductor device according to the comparative example has a structure in which a metallic insertion layer M10 and an intermediate insulating layer NN10 are omitted from the structure of FIG. 1. In this case, the insulating capping layer NC20 may be provided on the recess gate G10 to fill an upper region of the recess region R10. The bottom surface of the insulating capping layer NC20 is in contact with the upper surface of the recess gate G10, and the side surface of the insulating capping layer NC20 is in contact with an inner surface of the gate insulating layer GN10. The insulating capping layer NC20 may face the semiconductor region A20 with the gate insulating layer GN10 interposed therebetween. The plurality of semiconductor regions A20 may include a first semiconductor region A21, a second semiconductor region A22, and a third semiconductor region A23. The first semiconductor region A21 may be a first source region, the second semiconductor region A22 may be a drain region, or common drain region, and the third semiconductor region A23 may be a second source region. Other components may be the same as or similar to those described with reference to FIG. 1.

Figure 3:
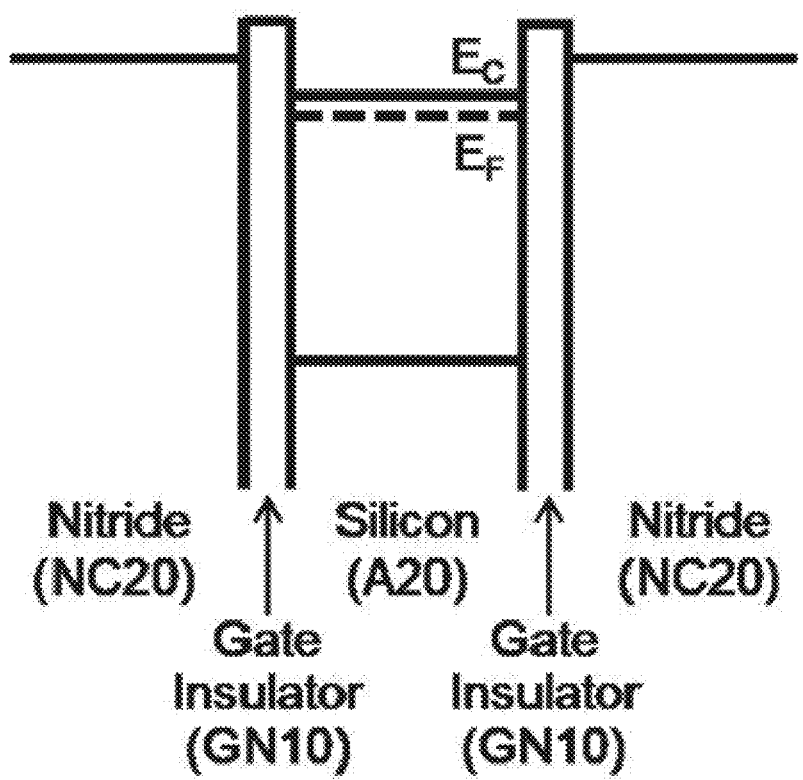
FIG. 3 is an energy band diagram of a semiconductor region, a gate insulating layer, and an insulating capping layer in the semiconductor device according to the comparative example described with reference to FIG. 2.

FIG. 3 is an energy band diagram of a semiconductor region A20, a gate insulating layer GN10, and an insulating capping layer NC20 in the semiconductor device according to the comparative example described with reference to FIG. 2. FIG. 3 shows an exemplary case where the semiconductor region A20 is an n-type semiconductor region. Here, reference numeral $E_C$ denotes the lowest energy level of conduction band, i.e., conduction band edge, and $E_F$ denotes a Fermi level. These denotations are also applicable in FIGS. 4 to 7.

Referring to FIG. 3, in the semiconductor device according to the comparative example, since the insulating capping layer NC20 does not affect the energy band of the semiconductor region A20, the semiconductor region A20 maintains the energy band in an equilibrium state. A charge-plasma effect does not occur between the insulating capping layer NC20 and the semiconductor region A20.

Figure 4:
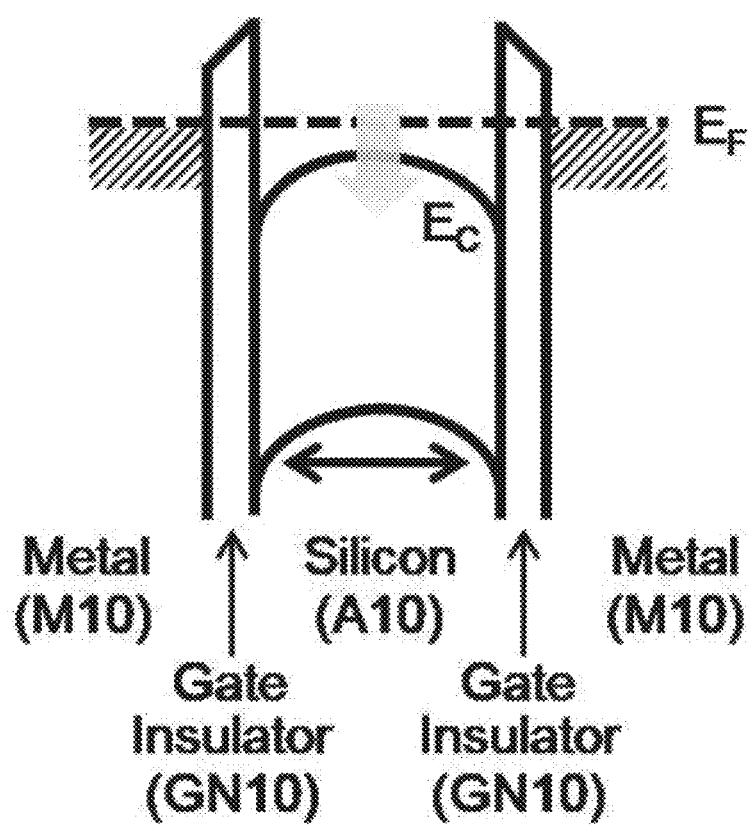
FIG. 4 is an energy band diagram of a semiconductor region, a gate insulating layer, and a metallic insertion layer in the semiconductor device according to the exemplary embodiment described with reference to FIG. 1.

FIG. 4 is an energy band diagram of a semiconductor region A10, a gate insulating layer GN10, and a metallic insertion layer M10 in the semiconductor device according to the exemplary embodiment described with reference to FIG. 1. FIG. 4 is a case where the semiconductor region A10 is an n-type semiconductor region.

Referring to FIG. 4, a metallic insertion layer M10 may be disposed on both sides of the semiconductor region A10, and a gate insulating layer GN10 may be disposed between the semiconductor region A10 and each metallic insertion layer M10. The thickness of the gate insulating layer GN10 may be relatively thin (as detailed below). In this case, a charge-plasma effect may occur between the metallic insertion layer M10 and the semiconductor region A10. As a result, the energy band of the semiconductor region A10 may be changed by the metallic insertion layer M10. As $E_C$ of the semiconductor region A10 goes downwardly, it may be lower than $E_F$. Since the metallic insertion layers M10 are disposed on both sides of the semiconductor region A10, a charge-plasma effect may occur due to the metallic insertion layers M10 from both sides of the semiconductor region A10. At this time, when the length of the semiconductor region A10 (the length in the horizontal direction in the drawing), that is, the distance or horizontal distance between the two gate insulating layers GN10 is small, the energy band may be changed in the entire area of the semiconductor region A10 by the two metallic insertion layers M10. Accordingly, the $E_C$ may be lower than the $E_F$ in substantially the entire area of the semiconductor area A10. This may mean that the effective doping concentration, i.e., virtual doping concentration of the semiconductor region A10 is increased. Even if the actual doping concentration of the semiconductor region A10 is relatively small, the semiconductor region A10 may have a relatively high effective doping concentration, i.e., a virtual doping concentration due to the charge-plasma effect by the metallic insertion layer M10. As a result, an effect such as an increase in on-current of the semiconductor device may be obtained. According to such an embodiment of the present invention, it is possible to reduce/avoid the limitations and difficulties in increasing the doping concentration due to scale-down of the device.

As described above, in order to change the energy band in substantially the entire area of the semiconductor area A10, it may be preferable that the length of the semiconductor area A10 is relatively small. In this regard, the semiconductor region A10 may have a length smaller than the Debye length. As a specific example, the semiconductor region A10 may have a length of less than about 10 nm, for example, about 3 nm or more and less than 10 nm. Alternatively, the semiconductor region A10 may have a length of about 8 nm or less. In addition, in order to obtain the above-described charge-plasma effect well, it may be preferable that the thickness of the gate insulating layer GN10 is relatively thin. For example, the gate insulating layer GN10 may have a thickness of about 6.5 nm or less. In this case, the energy band transformation of the semiconductor region A10 by the metallic insertion layer M10 may occur. However, the length range of the semiconductor region A10 and the thickness range of the gate insulating layer GN10 are exemplary, and depending on conditions such as a material applied thereto or a configuration of the metallic insertion layer M10, the above length range or the thickness range may vary. For example, the length of the source/drain region in which the corresponding charge-plasma effect may vary according to the size of the source/drain region and the value of the work function of the metallic insertion layer M10. In addition, when the gate insulating layer GN10 is silicon oxide, the thickness of the gate insulating layer GN10 may be about 6.5 nm or less. The gate insulating layer GN10, however, may have a different thickness depending on the material of the gate insulating layer GN10.

Figure 5:
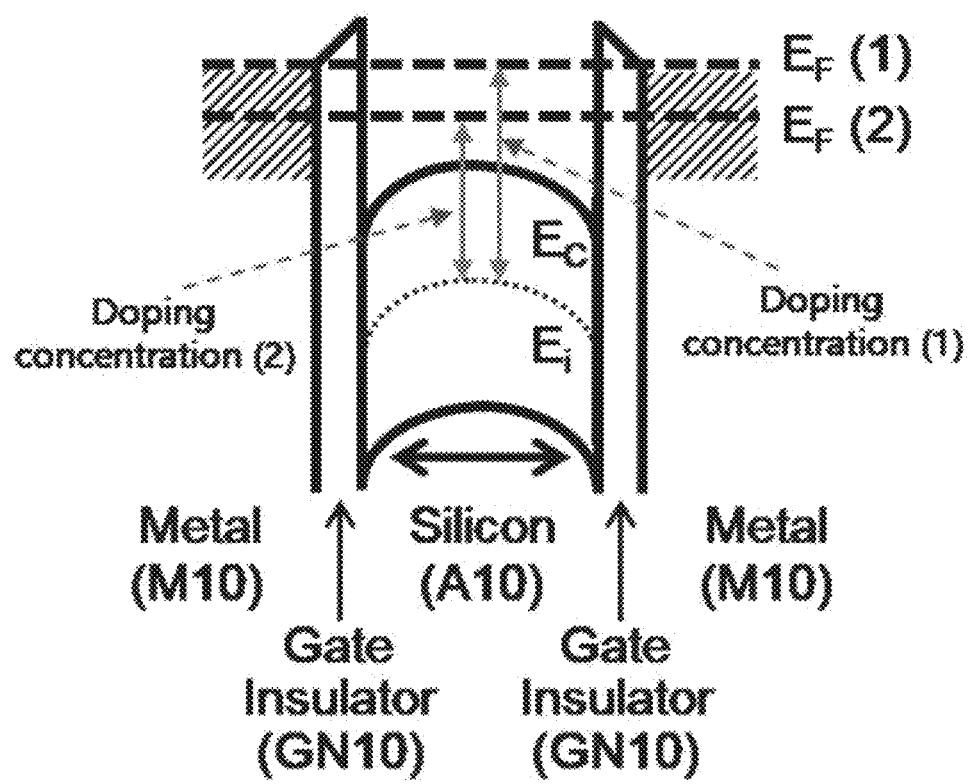
FIG. 5 is an energy band diagram of a semiconductor region, a gate insulating layer, and a metallic insertion layer in the semiconductor device according to the embodiment described with reference to FIG. 1.

FIG. 5 is an energy band diagram of a semiconductor region A10, a gate insulating layer GN10, and a metallic insertion layer M10 in the semiconductor device according to the embodiment described with reference to FIG. 1. FIG. 5 is a diagram showing an effect that the virtual doping concentration is increased (by the charge-plasma effect) as the work function of the metallic insertion layer M10 decreases in the case where the semiconductor region A10 is an n-type semiconductor (silicon). Here, reference numeral $E_i$ denotes an intrinsic Fermi level.

Referring to FIG. 5, when using the metallic insertion layer M10 corresponding to $E_F(1)$ having a relatively low work function, a relatively higher effective doping concentration (virtual doping concentration), that is, doping concentration (1) may be obtained. When the metallic insertion layer M10 corresponding to $E_F(2)$ having a relatively high work function is used, a relatively low effective doping concentration (virtual doping concentration), that is, a doping concentration (2) may be obtained. However, in both cases, an effect of increasing the effective doping concentration (virtual doping concentration) of the semiconductor region A10 may be obtained. Based on a case that the semiconductor region A10 is an n-type semiconductor, as the work function of the metallic insertion layer M10 decreases, the effect of increasing the virtual doping concentration increases due to the charge-plasma effect.

Figure 6:
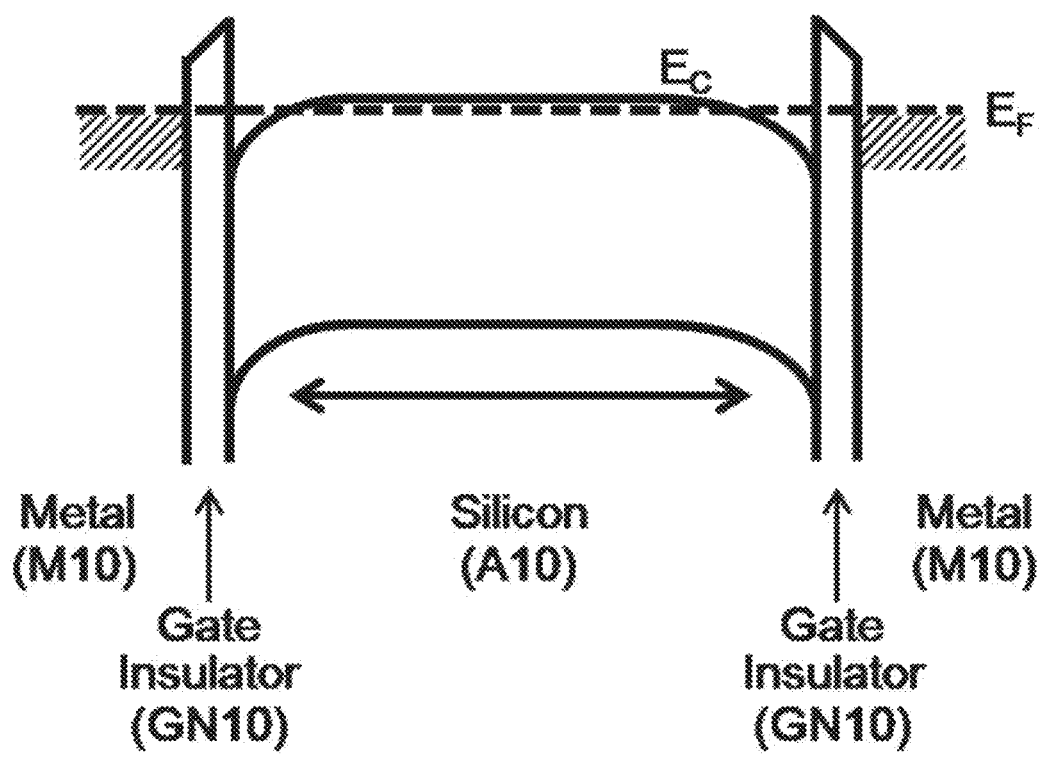
FIG. 6 is a diagram showing an energy band diagram which may be observed in the semiconductor region, a gate insulating layer, and a metallic insertion layer in a semiconductor device according to the embodiment described with reference to FIG. 1, when the length of the semiconductor region is relatively large as compared to the length of the semiconductor region in FIG. 5.

FIG. 6 is a diagram showing an energy band diagram which may be observed in the semiconductor region A10, the gate insulating layer GN10, and the metallic insertion layer M10 in the semiconductor device according to the embodiment described with reference to FIG. 1, when the length of the semiconductor region A10 is relatively large as compared to the length of the semiconductor regions in FIG. 5.

Referring to FIG. 6, when the length of the semiconductor region A10 is relatively large, it may be difficult to change a shape of the energy band in the central portion of the semiconductor region A10, and the energy band structure in an equilibrium state may be formed in the central portion. In this case, it may be difficult to obtain an effect of increasing an effective doping concentration (virtual doping concentration) due to an increase in the Fermi level in the entire area of the semiconductor region A10. However, as described with reference to FIG. 4, as the length of the semiconductor region A10 is reduced, an effect that a bending phenomenon of the energy band structure appears over the entire region of the semiconductor region A10, and, therefore, the doping concentration (virtual doping concentration) over the entire region of the semiconductor region A10 may be obtained.

Figure 7:
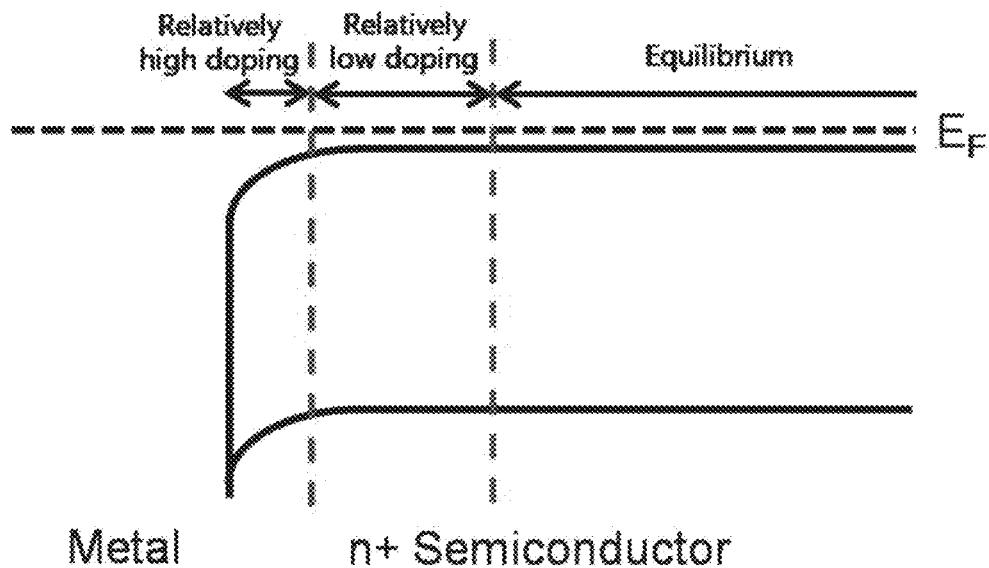
FIG. 7 is a diagram illustrating a phenomenon in which the energy band of the semiconductor is changed, i.e., bending due to a charge-plasma effect when a metal and a semiconductor are bonded or contacted.

FIG. 7 is a diagram illustrating a phenomenon in which the energy band of the semiconductor is changed (i.e., bended) due to a charge-plasma effect when a metal and a semiconductor are bonded or contacted.

Referring to FIG. 7, when a metal-semiconductor is bonded, when the work function of the metal is lower than the work function of the semiconductor, the band diagram of the semiconductor may be bent due to the negative Schottky barrier diagram. In practice, a highly doped region in a virtual state may be formed by controlling the Fermi level of a semiconductor having a low doping concentration. In one embodiment, the first portion of the semiconductor bonded to the metal may be a region doped with a relatively high concentration, and the second portion of the semiconductor adjacent to the first portion may be a region doped with a relatively low concentration. A third part of the semiconductor adjacent to the second part may have a band of an equilibrium state.

In the case of metal-semiconductor bonding or contact, the case where the work function of the metal is lower than that of the semiconductor may be referred to as an ohmic contact, and as the ohmic contact has a negative Schottky barrier, the transfer of electric charges may be carried out freely through the Schottky barrier. When the ohmic contact is formed in this way, the closer to the metal, the conduction band edge level $E_c$ of the semiconductor may be lower than the Fermi level $E_F$. If the thickness of the semiconductor is thinner than the Debye length, $E_c$, may be lower than $E_F$ in all of the semiconductor thickness. Such charge-plasma effect may be generated even if there is a relatively thin insulating film, for example, a dielectric oxide between the metal and the semiconductor, and through this effect, a virtually high doping concentration may be formed in the semiconductor. This is the same as described above with reference to FIG. 4 and FIG. 5.

Figure 8:
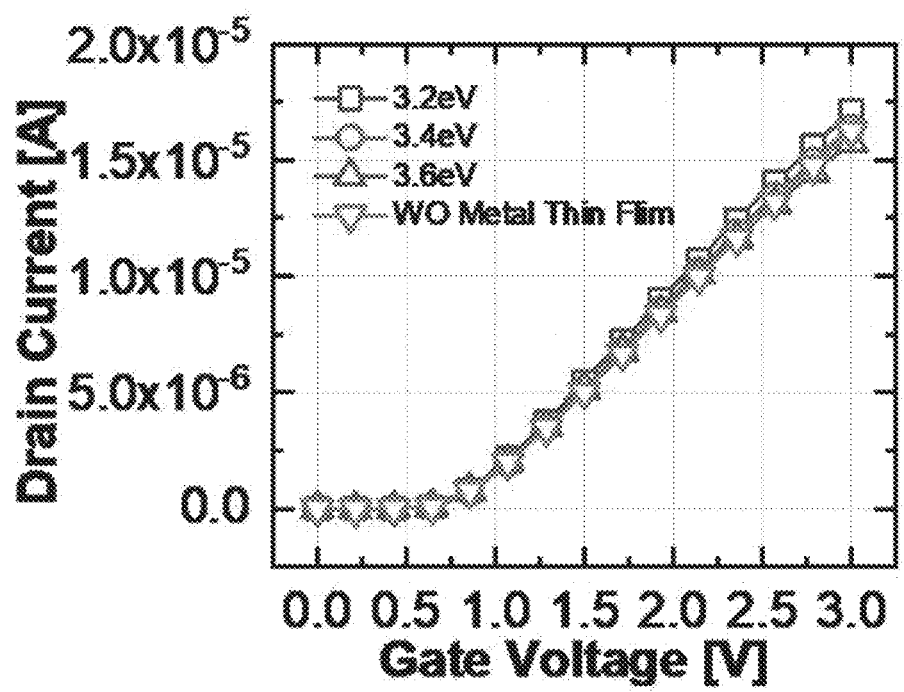
FIG. 8 is a graph showing a result of evaluating a change characteristic of a drain current according to a gate voltage of a semiconductor device according to another embodiment of the present invention.

FIG. 8 is a graph showing a result of a change of a drain current value according to a gate voltage of a semiconductor device according to another embodiment of the present invention. The semiconductor device according to the above embodiment has the structure of FIG. 1, wherein the semiconductor region A10 was an n-type semiconductor (silicon). In the semiconductor device according to this embodiment, the devices where the work function of the metallic insertion layer M10 is 3.2 eV, 3.4 eV, and 3.6 eV were evaluated, respectively. In addition, FIG. 8 includes the results of the comparative device where the metallic intercalation layer is not used, i.e, WO Metal Thin Film. The case in which the metallic insertion layer is omitted corresponds to the comparative example described with reference to FIG. 2. In addition, the result of FIG. 8 is a case where the length of the semiconductor region A10, that is, the source/drain region is 8 nm, and the thickness of the gate insulating layer (oxide film) GN10 is 3 nm, and the off-current, $I_{off}$ was ~2×10$^{-14}$ A.

Referring to FIG. 8, it may be seen that the on-current of the semiconductor device increases as the work function of the metallic insertion layer used decreases.

Figure 9:
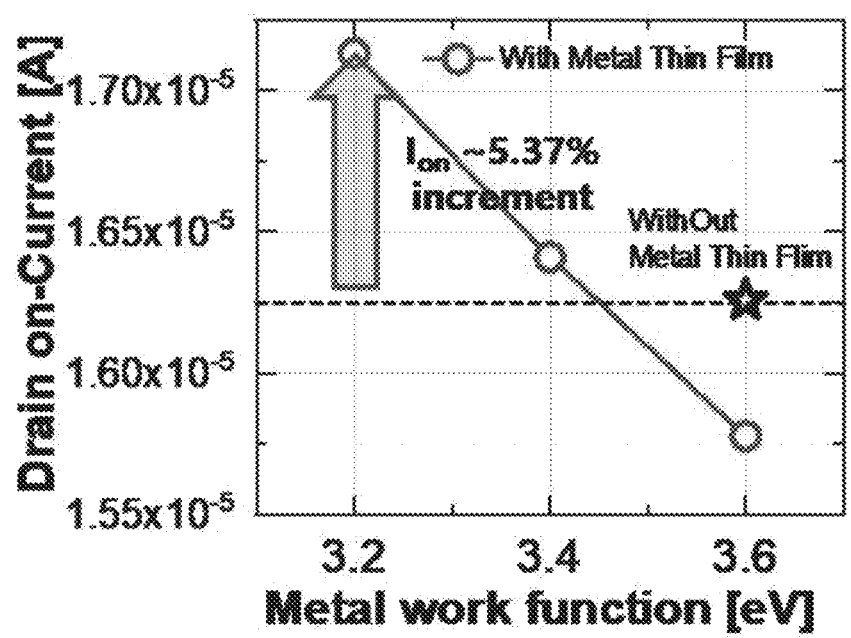
FIG. 9 is a graph obtained from the results of FIG. 8 and showing a change in on-current of a semiconductor device according to a work function of a metallic insertion layer used.

FIG. 9 is a graph obtained from the results of FIG. 8 and showing a change in on-current of a semiconductor device according to the work function of the metallic insertion layer used. FIG. 9 also includes the results (indicated by a star shape) of the case where the metallic insertion layer is omitted (i.e., without Metal Thin Film).

Referring to FIG. 9, it may be seen that the on-current of the semiconductor device increases as the work function of the metallic insertion layer used decreases. For example, when the work function of the metallic insertion layer is 3.2 eV, it may be seen that on-current is increased by about 5.37% as compared to the case where the metallic insertion layer is not used (indicated by a star shape). According to one embodiment of the present invention, the effective doping concentration (virtual doping concentration) of the semiconductor region, for example, a source/drain region may be increased by the charge-plasma effect, an increase of on-current may be obtained.

Figure 10:
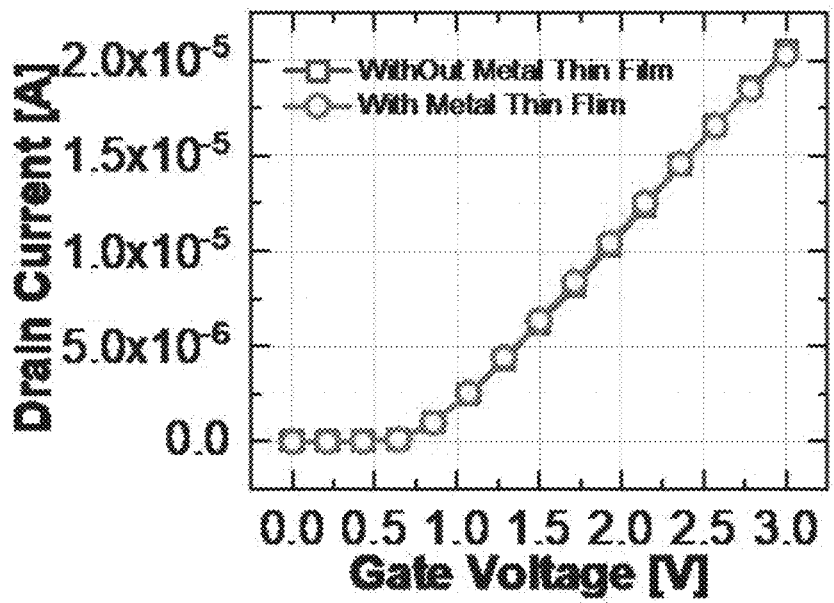
FIG. 10 to FIG. 12 are graphs showing results of evaluating a change characteristic of a drain current according to a gate voltage of a semiconductor device according to another embodiment of the present invention.
Figure 11:
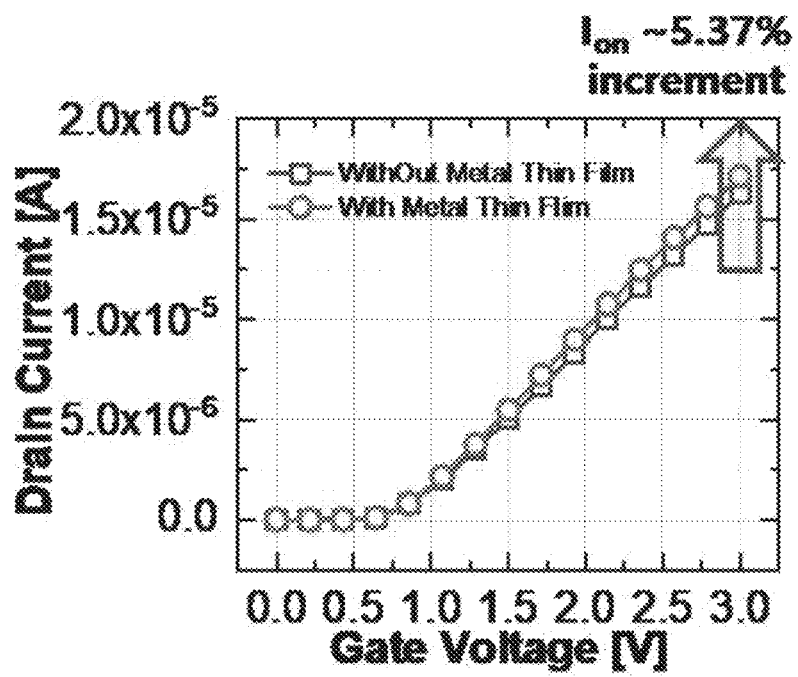
Figure 12:
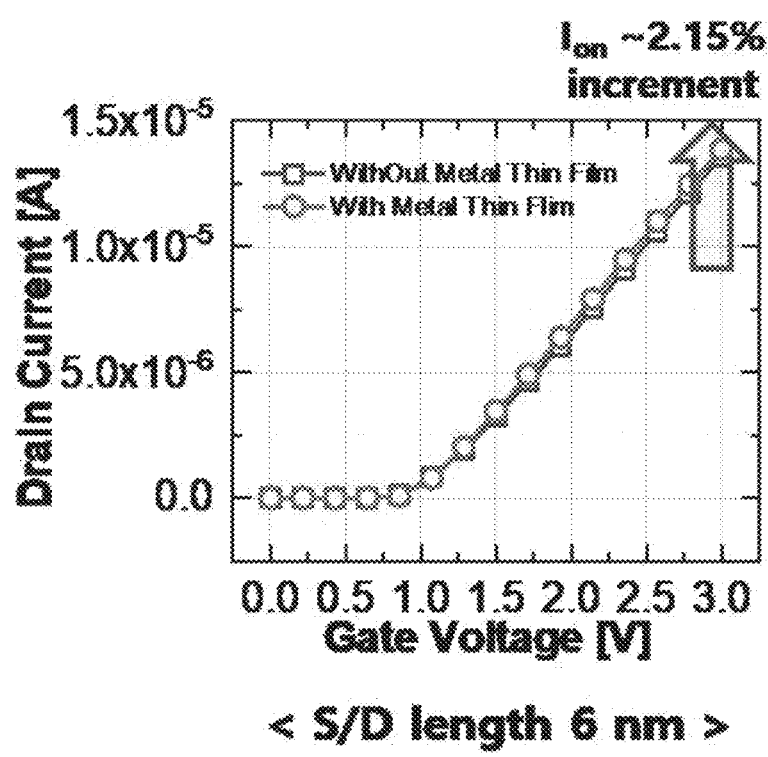

FIG. 10 to FIG. 12 are graphs showing characteristics of a drain current according to a gate voltage of a semiconductor device according to another embodiment of the present invention where the length of the semiconductor region is changed from one graph to another. FIG. 10 is a case where the length of the semiconductor region (A10 in FIG. 1), that is, the source/drain region is 10 nm, and FIG. 11 is the semiconductor region (A10) in FIG. 1), that the length of the source/drain region is 8 nm. FIG. 12 is a case where the length of the semiconductor region (A10 of FIG. 1), that is, the source/drain region is 6 nm. The work function of the metallic insertion layer used in the embodiments of FIGS. 10 to 12 was 12 eV, the off-current ($I_{off}$) was ~2×10$^{-14}$ A, and the semiconductor region was an n-type semiconductor (silicon). In addition, FIG. 10 to FIG. 12 also include results of the case where the metallic insertion layer is not used (comparative example).

Referring to FIG. 10, when the length of the source/drain region is 10 nm, it was observed that the results of a device using the metallic insertion layer and a comparative device not using the metallic insertion layer are almost similar. However, depending on the material of the metallic insertion layer or other conditions, the effect generated by using the metallic insertion layer may appear.

Referring to FIG. 11, when the length of the source/drain region is 8 nm, when the metallic insertion layer is used, the on-current is increased by about 5.37% as compared with a case that the metallic insertion layer is not used.

Referring to FIG. 12, when the length of the source/drain region is 6 nm, when the metallic insertion layer is used, the on-current is increased by about 2.15%, as compared with a case that the metallic insertion layer is not used.

According to various embodiments of the present invention, even if a high concentration doping process is not applied to the semiconductor region, it is possible to implement a semiconductor device having a recess gate structure capable of easily improving on-current characteristics and the like by effectively increasing an effective doping concentration (i.e., a virtual doping concentration). In particular, it is possible to implement a semiconductor device having a recessed gate structure which may increase the effective doping concentration (i.e., virtual doping concentration) of the semiconductor region by changing the energy band of the semiconductor region (source/drain region) by using the charge-plasma effect.

According to various embodiments of the present invention, it is possible to overcome the limitation of the conventional high concentration doping process of the source/drain through the charge-plasma effect and to increase the conduction current (i.e., on-state current) of the device, and at the same time, to obtain excellent performance even at low doping concentration. In this regard, it is possible to reduce/avoid variations between devices due to intra-wafer processes such as random dopant fluctuation (RDF) and the like. That is, it is possible to obtain a price reduction effect through scaling-down of semiconductor devices and reduction of defect rates by preventing or minimizing performance deviations between devices in a wafer, which may be caused by a physically high concentration doping process. The technology according to the embodiments of the present invention may be a technology capable of overcoming the limitation of device miniaturization due to an increase in the difficulties of the source and drain processes. In addition, when the technology according to the embodiments of the present invention is used, it is possible to implement a semiconductor device capable of maintaining operation characteristics even at a low applied voltage through an increase in conduction current. Therefore, an effect that the amount of power consumption is reduced by lowering the applied voltage may be obtained.

According to one embodiment of the present invention, an effect of increasing an effective doping concentration (i.e., a virtual doping concentration) may be obtained (while maintaining or lowering a doping concentration through a physical doping process) by virtue of a charge-plasma effect. In this regard, it is possible to obtain an effect of improving device performance in terms of various aspects, for example, characteristics related to drain linear current, subthreshold current, subthreshold swing (SS), and drain-induced barrier bottoming (DIBL).

FIG. 13A to FIG. 13G are cross-sectional diagrams illustrating a method of manufacturing a semiconductor device having a recess gate structure according to another embodiment of the present invention.

Figure 13A:
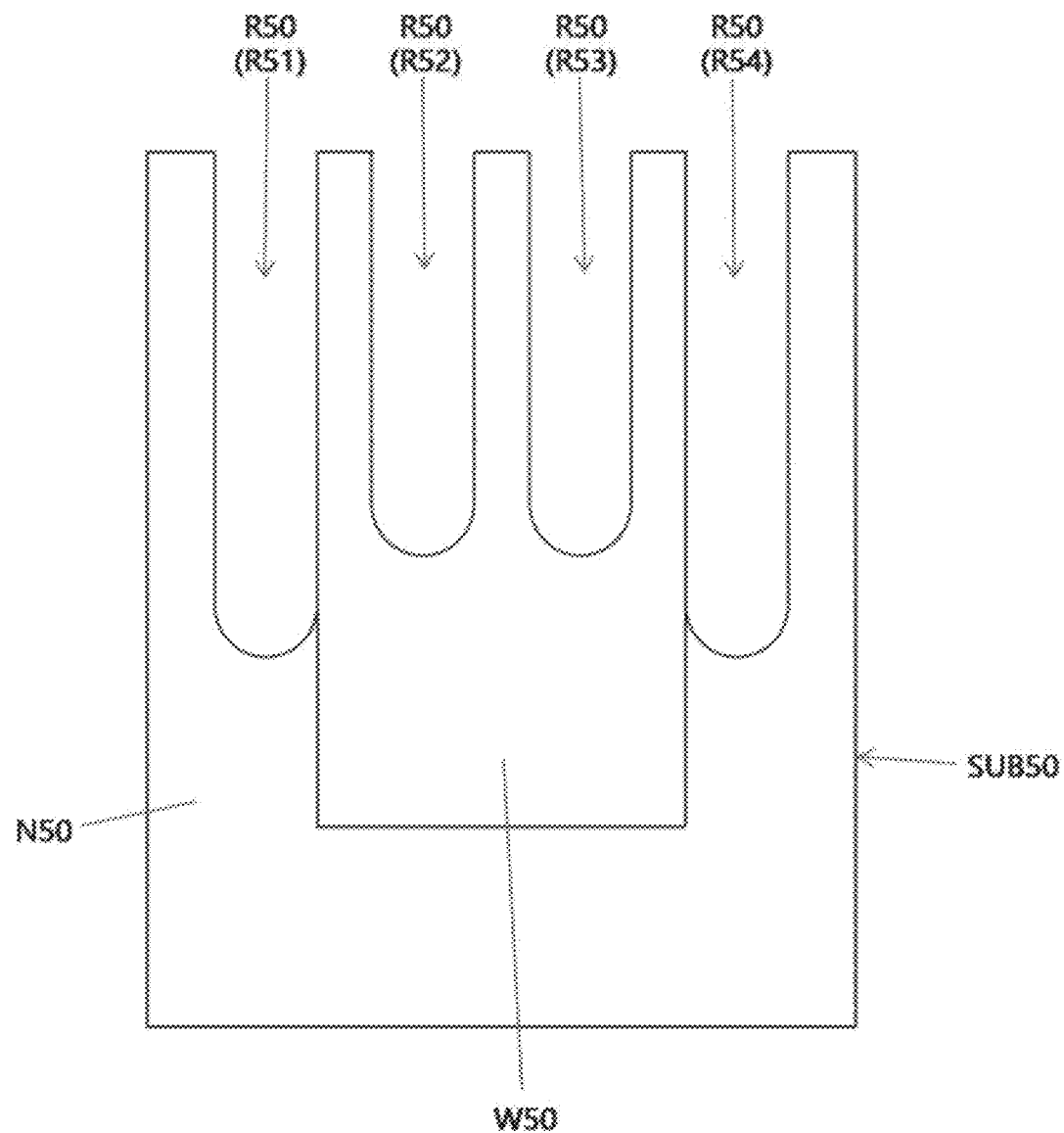
FIG. 13A to FIG. 13G are cross-sectional diagrams illustrating a method of manufacturing a semiconductor device having a recess gate structure according to another embodiment of the present invention.

Referring to FIG. 13A, a substrate SUB50 in which a plurality of recess regions R50 are formed may be provided. The plurality of recess regions R50 may be regions recessed from an upper surface of the substrate SUB50. An insulating region N50 may be provided on the substrate SUB50, and a well region W50 may be provided. The insulating region N50 may be provided to define the well region W50. The well region W50 may be a semiconductor region doped with a predetermined impurity. For example, the well region W50 may be a region doped with p-type impurities, and in this case, a plurality of semiconductor regions (A50 in FIG. 13G) formed later may be regions doped with n-type impurities. Alternatively, the well region W10 may be a region doped with an n-type impurity. In this case, a plurality of semiconductor regions (A50 in FIG. 13G) formed later may be regions doped with a p-type impurity. The well region W50 may include Si, as a non-limiting example. The insulating region N50 may include, for example, $SiO_2$ or other insulating materials.

The plurality of recess regions R50 may include, for example, a first recess region R51, a second recess region R52, a third recess region R53, and a fourth recess region R54 that are spaced apart from each other. The first recess region R51 may be provided in the insulating region N50 on one side of the well region W50, and the fourth recess region R54 may be provided in the insulating region N50 on the other side of the well region W50. Each of the first and fourth recess regions R51 and R54 may be disposed to be in contact with or close to the well region W50. The second and third recess regions R52 and R53 may be provided to be inserted into the well region W50 between the first and fourth recess regions R51 and R54. The depths of the first and fourth recess regions R51 and R54 may be deeper than the depths of the second and third recess regions R52 and R53. Here, the numbering order of the first to fourth recess regions R51 to R54 is exemplary and may vary.

Figure 13B:
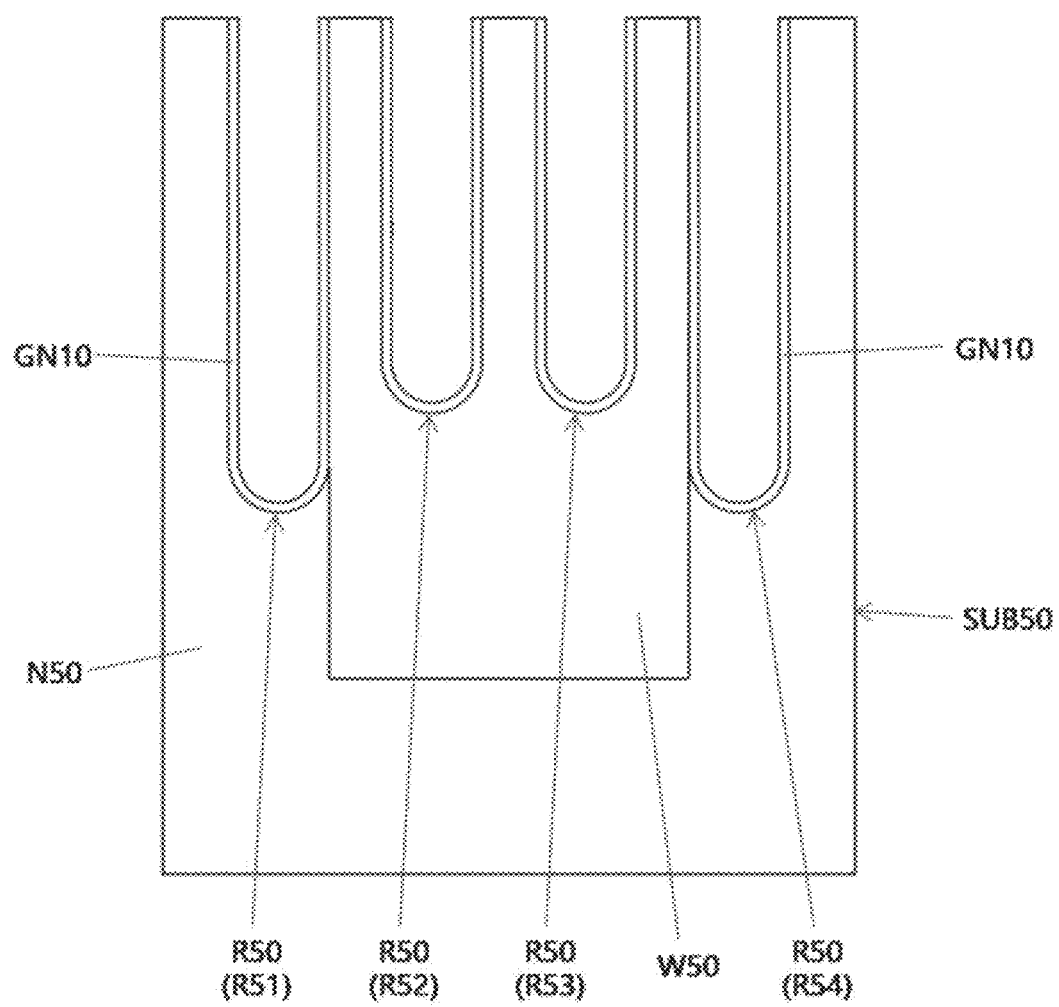

Referring to FIG. 13B, a gate insulating layer GN10 may be formed on an inner surface of each of the plurality of recess regions R50. The gate insulating layer GN10 may include, for example, $SiO_2$ or other insulating materials. A material that can be used as a gate insulating material in a general transistor device may be applied as a material of the gate insulating layer GN10. The gate insulating layer GN10 having a thin thickness may be substantially conformally formed along the inner surface of the recess region R50.

Figure 13C:
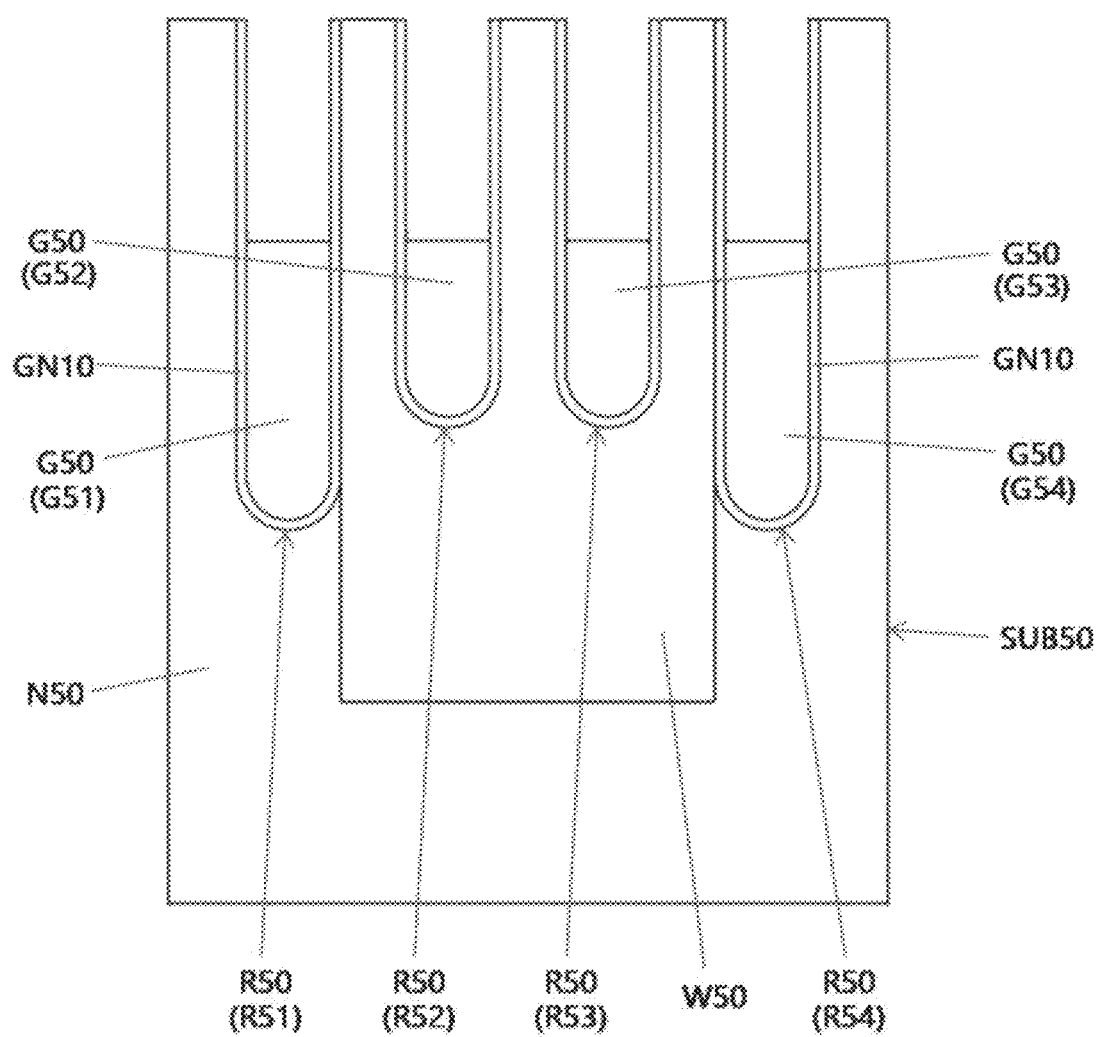

Referring to FIG. 13C, a recess gate G50 may be formed on the gate insulating layer GN10 in each of the plurality of recess regions R50. The recess gate G50 may be provided to fill a bottom region of the recess region R50. The recess gate G50 may be formed of a predetermined conductive material. The recess gate G50 may be referred to as a recess gate electrode.

Figure 13D:
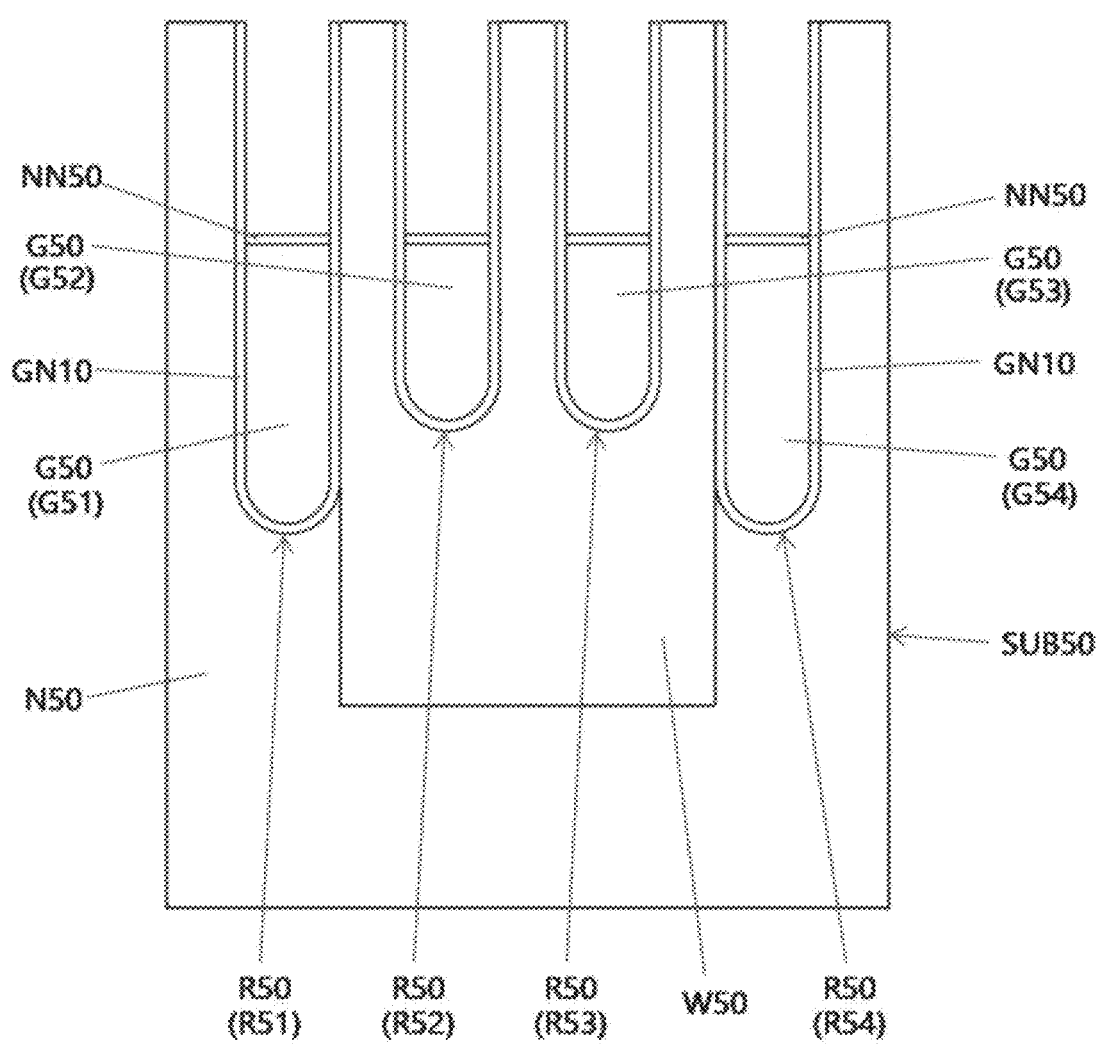

Referring to FIG. 13D, an intermediate insulating layer NN50 disposed on the recess gate G50 may be formed inside each of the plurality of recess regions R50. The intermediate insulating layer NN50 may be formed of, for example, $Si_xN_y$, for example, $Si_3N_4$, but may also be formed of another insulating material. The material of the intermediate insulating layer NN50 may be the same as a material of the insulating capping layer (NC50 of FIG. 13F) to be formed later. In another embodiment, the material of the intermediate insulating layer NN50 may be different from the material of the insulating capping layer (NC50 of FIG. 13F). The intermediate insulating layer NN50 may be formed by, for example, anisotropic deposition method, or may be formed by various other methods.

Figure 13E:
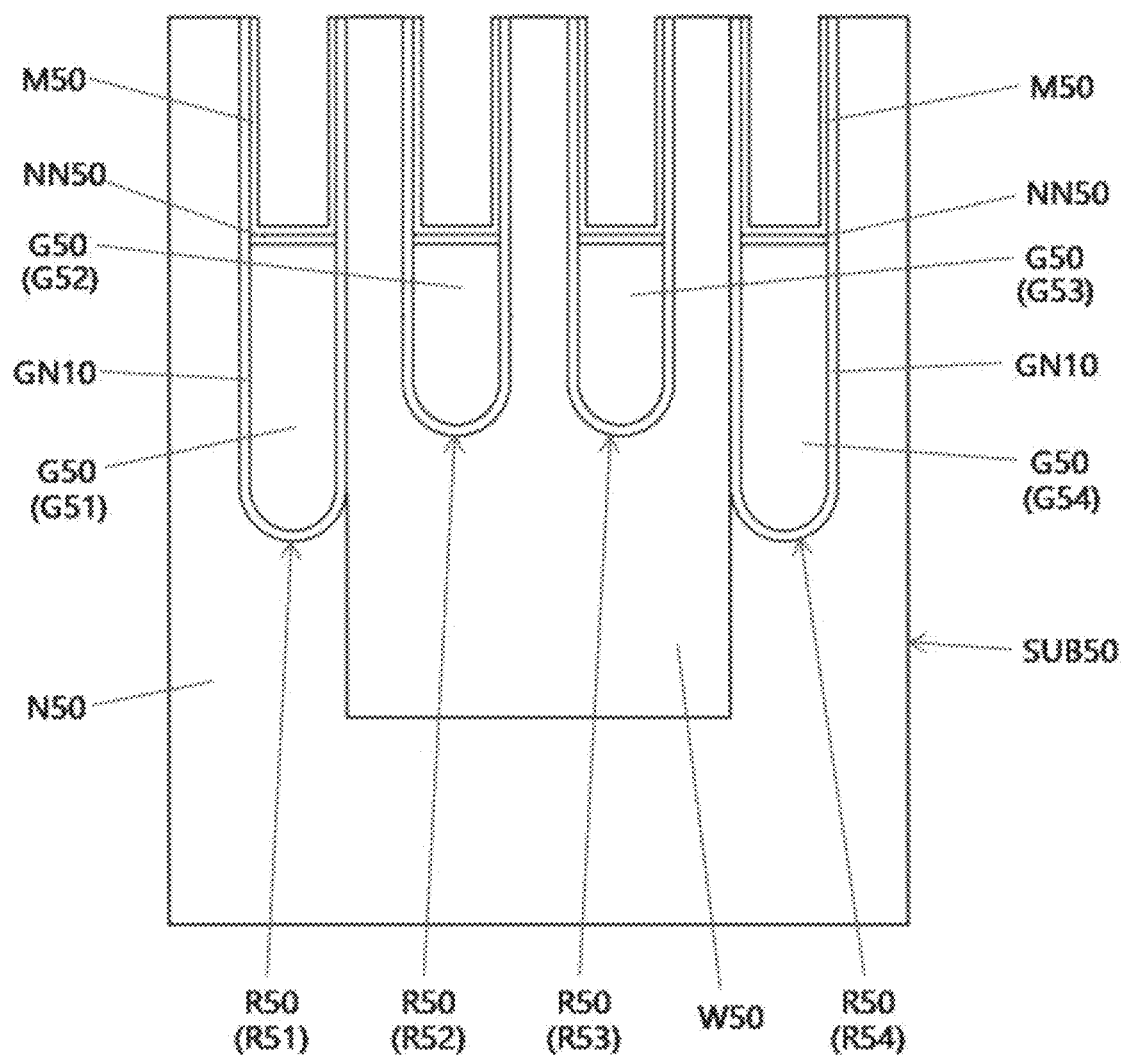
Figure 13F:
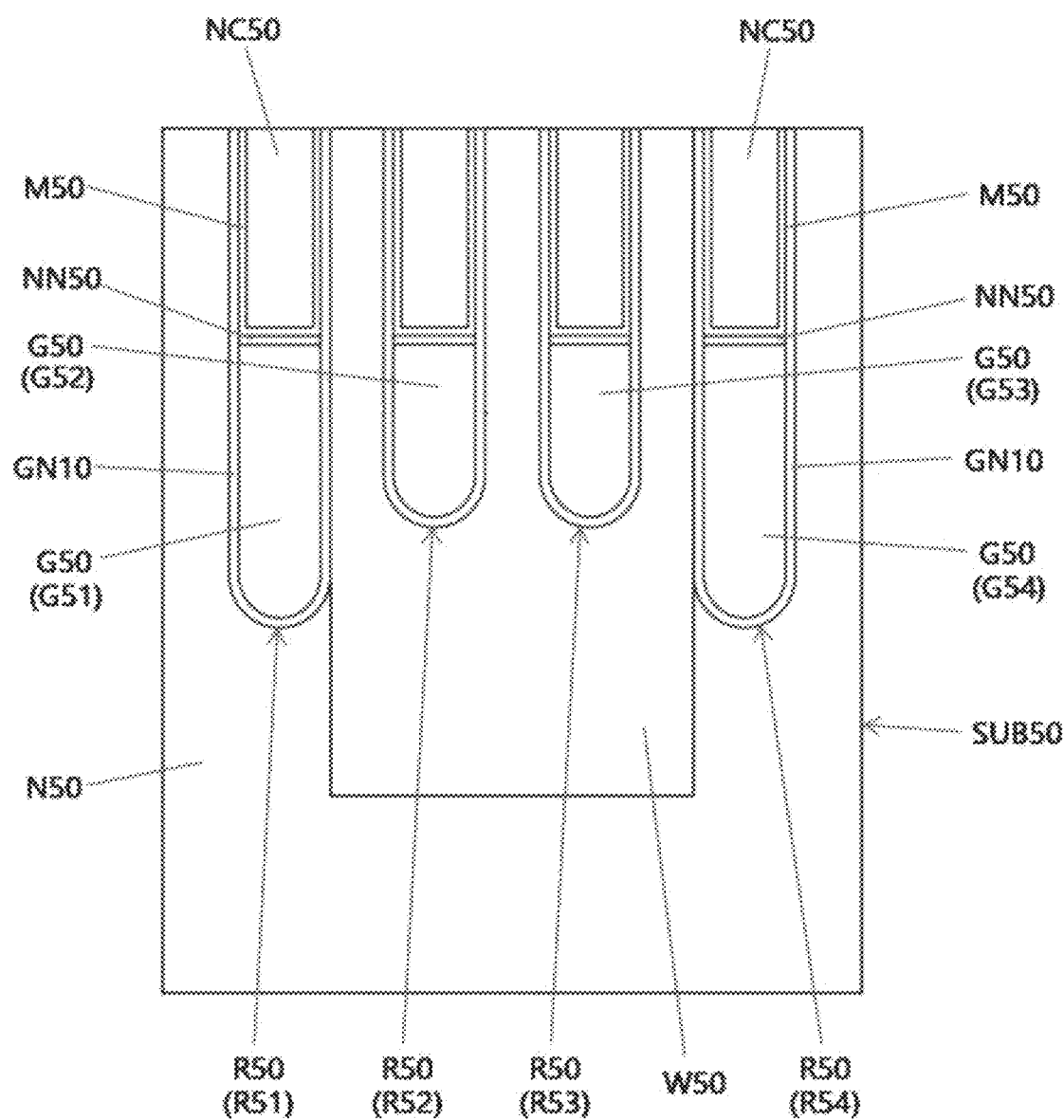

Referring to FIG. 13E, a metallic insertion layer M50 disposed on the intermediate insulating layer NN50 may be formed in each of the plurality of recess regions R50. The metallic insertion layer M50 may be extended to cover the inner surface of the gate insulating layer GN50 while covering the upper surface of the intermediate insulating layer NN50. The metallic insertion layer M50 may be formed of a metal or a metallic material. The metallic insertion layer M50 may be formed to have a fairly thin thickness, for example, a thickness of about 20 nm or less or a thickness of about 10 nm or less.

Referring to FIG. 3F, an insulating capping layer NC50 disposed on the metallic insertion layer M50 may be formed inside each of the plurality of recess regions R50. The insulating capping layer NC50 may be provided in the upper region of the recess region R50. The insulating capping layer NC50 may be formed of, for example, $Si_xN_y$, for example, $Si_3N_4$. However, the material of the insulating capping layer NC50 may be changed. In one embodiment, after depositing a material layer for forming the insulating capping layer NC50 on the entire upper surface of the substrate SUB50, a chemical mechanical polishing (CMP) process is performed on the deposited material layer, so that the insulating capping layer NC50 may be formed.

Figure 13G:
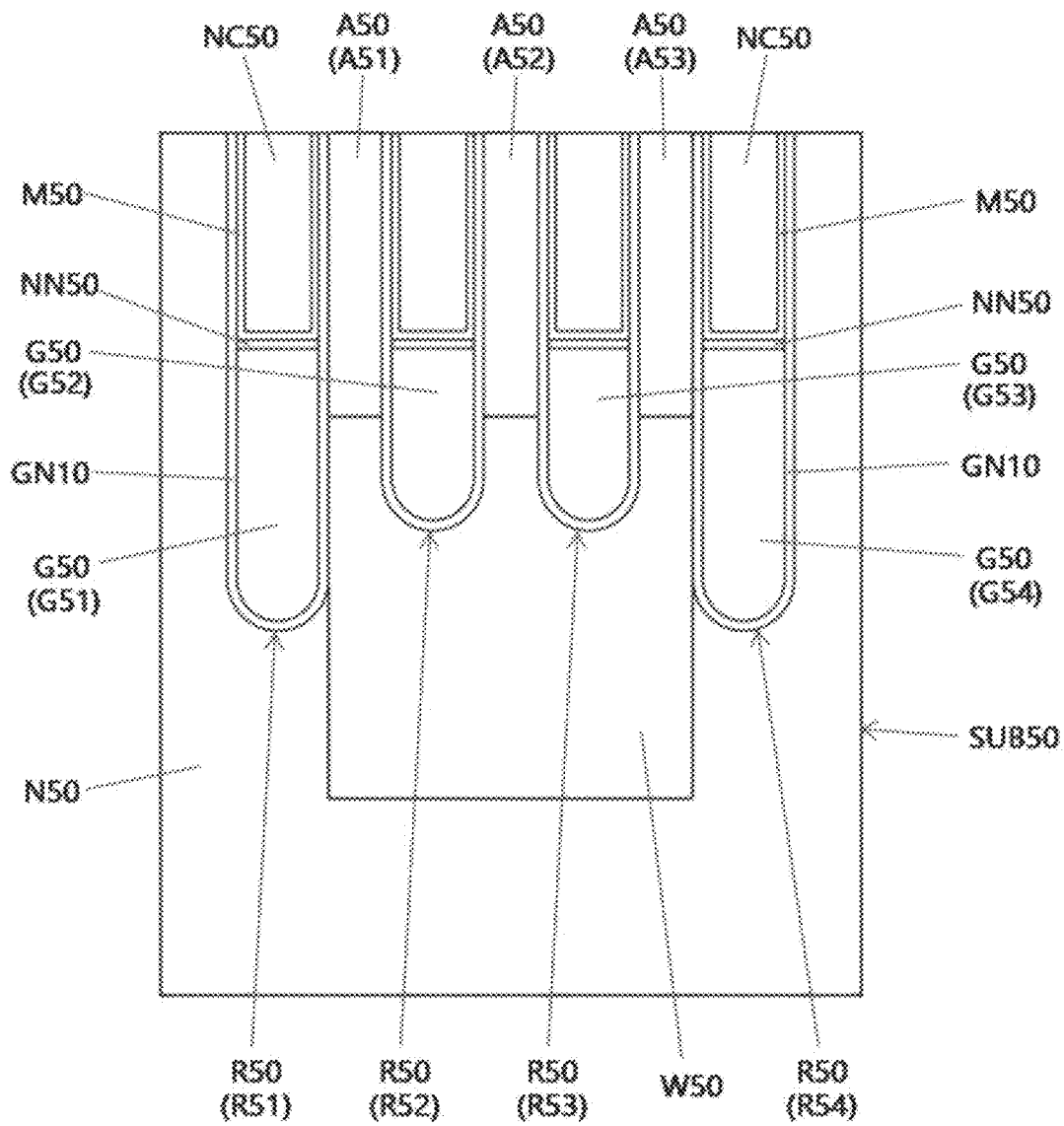

Referring to FIG. 13G, a plurality of semiconductor regions A50 acting as sources/drains may be formed among the plurality of recess regions R50 of the substrate SUB50. The plurality of semiconductor regions A50 may be regions doped with impurities, that is, impurity regions (doped regions) which can be formed by ion-implantation or in-situ doping. The plurality of semiconductor regions A50 may be regions doped with impurities of a type opposite to that of the well region W50. It may be said that the plurality of semiconductor regions A50 are formed in the upper layer portion of the well region W50. Although not shown, in a subsequent step, some of the upper layers of the plurality of semiconductor regions A50 may be recessed in the depth direction thereof.

In this method embodiment, the metallic insertion layer M50 may be provided so that it may be extended along the bottom surface and side surfaces of the insulating capping layer NC50. The metallic insertion layer M50 may be provided between the recess gate G50 and the insulating capping layer NC50 and may be extended between the insulating capping layer NC50 and the gate insulating layer GN50. The intermediate insulating layer NN50 may be provided between the metallic insertion layer M50 and the recess gate G50 to electrically insulate them from each other. Accordingly, the metallic insertion layer M50 may be electrically floating.

The plurality of semiconductor regions A50 may include a first semiconductor region A51 disposed between the first and second recess regions R51 and R52, a second semiconductor region A52 disposed between the second and third recess regions R52 and R53, and a third semiconductor region A53 disposed between the third and fourth recess regions R53 and R54. The first semiconductor region A51 may be a first source region, the second semiconductor region A52 may be a drain region, or common drain region, and the third semiconductor region A53 may be a second source region.

The recess gate G50 disposed in the first recess region R51 may be referred to as a first recess gate G51, the recess gate G50 disposed in the second recess region R52 may be referred to as a second recess gate G52, the recess gate G50 disposed in the third recess region R53 may be referred to as a third recess gate G53, and the recess gate G50 disposed in the fourth recess region R54 may be referred to as a fourth recess gate G54. Here, the first and fourth recess gates G51 and G54 may be passing gates, and the second and third recess gates G52 and G53 may be cell gates.

In one embodiment of the present invention, the metallic insertion layer M50 is configured to change the energy band of the semiconductor region A50 adjacent thereto and increase the effective doping concentration, i.e., virtual doping concentration of the semiconductor region A50. The metallic insertion layer M50 uses a charge-plasma effect to change the energy band of the adjacent semiconductor region A50, so that the effective doping concentration (that is, the virtual doping concentration) of the semiconductor region A50 may play a role in increasing the effective doping concentration. The on-current of the semiconductor device may be effectively increased by the metallic insertion layer M50. The roles and functions of the metallic insertion layer M50 are the same as (or similar to) those described with reference to FIGS. 4 and 5.

When the plurality of semiconductor regions A50 are n-type semiconductor regions, the metallic insertion layer M50 may have a work function lower than that of the n-type semiconductor region. In this case, the effect of increasing the doping concentration of the semiconductor region A50 due to the metallic insertion layer M50 may be more prominent than if no metal insertion layer were used. At this time, the metallic insertion layer M50 may include, for example, at least one from Ti, Ta, TaN, Al, Zr, TiW, Er, $ErC_2$, and Gd. When the plurality of semiconductor regions A50 are n-type semiconductor regions, the semiconductor device of FIG. 13G may be referred to as an n-type MOSFET device.

When the plurality of semiconductor regions A50 are p-type semiconductor regions, the metallic insertion layer M50 may have a work function higher than that of the p-type semiconductor region. In this case, the effect of increasing the doping concentration of the semiconductor region A50 due to the metallic insertion layer M50 may be more effective than if no metal insertion layer were used. In this case, the metallic insertion layer M50 may include, for example, at least one from Au, Pt, Pd, Ni, and Co. When the plurality of semiconductor regions A50 are p-type semiconductor regions, the semiconductor device of FIG. 13G may be referred to as a p-type MOSFET device.

For example, each of the plurality of semiconductor regions A50 may have a length of less than about 10 nm or less than about 8 nm. In addition, it may be desirable that the gate insulating layer GN10 has a thickness of, for example, about 6.5 nm or less. In addition, the configuration and features of the semiconductor device according to the embodiment(s) described with reference to FIG. 1 and FIG. 4 to FIG. 12 may be equally applied to the semiconductor device of FIG. 13G.

The semiconductor device according to the above embodiments may be applied to a core cell transistor (for example, a transistor which stores bit information in a memory element) and a passing transistor of a memory device (for example, a transistor which passes/transmits a voltage signal to the memory elements), and may also be usefully applied to various devices/apparatus to which a recess gate-based transistor is applied.

In the present specification, various embodiments of the present invention have been disclosed, and although specific terms have been used, these are merely used in a general sense to easily explain the technological contents of the present invention and to aid understanding of the present invention, and it is not intended to limit the scope of the present invention. In addition to the embodiments disclosed herein, it is apparent to those having a common knowledge in the related art that other modifications based on the technological concepts of the present invention may be implemented. In connection with a semiconductor device having a recess gate structure and a method of manufacturing the same according to the various embodiments described with reference to FIG. 1-FIG. 13G, those having a common knowledge in the related art will understand that various substitutions, changes and modifications may be made within the scope of the technical spirit of the present invention. Therefore, the scope of the invention should not be limited by the described embodiments.

EXPLANATION OF SYMBOLS

Description of Symbols for the Main Parts of the Drawing

A10, A50: semiconductor region
G10, G50: recess gate
GN10: gate insulating layer
M10, M50: metallic insertion layer
N10, N50: insulating region
NC10, NC50: insulating capping layer
NN10, NN50: intermediate insulating layer
R10, R50: recess region
SUB10, SUB50: substrate
W10, W50: well region

What is claimed is:

1. A semiconductor device comprising:
   a substrate having a plurality of recess regions and a plurality of semiconductor regions comprising a source region and a drain region defined between the plurality of recess regions;
   a gate insulating layer disposed on an inner surface of each of the plurality of recess regions;
   a recess gate disposed on the gate insulating layer in each of the plurality of recess regions;
   an insulating capping layer disposed above the recess gate in each of the plurality of recess regions;
   a metallic insertion layer disposed between a side surface of the gate insulating layer and a side surface of the insulating capping layer and facing a side surface of the source region or the drain region; and
   an intermediate insulating layer disposed between the metallic insertion layer and the recess gate to electrically insulate the metallic insertion layer from the recess gate,
   wherein the metallic insertion layer is an electrically floating layer, and
   wherein the metallic insertion layer is extended to cover an inner surface of the gate insulating layer between the gate insulating layer and the insulating capping layer while covering an entire upper surface of the intermediate insulating layer.

2. The semiconductor device of the claim 1, wherein the metallic insertion layer includes another portion extending from a portion disposed between the side surface of the insulating capping layer and the side surface of the gate insulating layer to a bottom portion of the insulating capping layer and an upper portion of the intermediate insulating layer.

3. The semiconductor device of the claim 1, wherein the metallic insertion layer is configured to increase an effective doping concentration of the semiconductor region by changing an energy band of the source or the drain region.

4. The semiconductor device of the claim 1, wherein the metallic insertion layer is configured to increase on-current of the semiconductor device.

5. The semiconductor device of the claim 1, wherein the plurality of recess regions includes a first recess region and a second recess region adjacent to each other, and the plurality of semiconductor regions includes a first semiconductor region disposed between the first and second recess regions,
   wherein a first metallic insertion layer is provided in the first recess region,
   wherein a second metallic insertion layer is provided in the second recess region, and
   wherein an energy band of the first semiconductor region is changed over the entire region of the first semiconductor region due to the first and second metallic insertion layers.

6. The semiconductor device of the claim 1, wherein each of the plurality of semiconductor regions has a length of less than about 10 nm.

7. The semiconductor device of the claim 1, wherein the plurality of semiconductor regions is an n-type semiconductor region, and the metallic insertion layer has a work function lower than that of the n-type semiconductor region.

8. The semiconductor device of the claim 7, wherein the metallic insertion layer includes at least one element selected from Ti, TiN, Ta, TaN, Al, Zr, TiW, Er, $ErC_2$, and Gd.

9. The semiconductor device of the claim 1, wherein the plurality of semiconductor regions is a p-type semiconductor region, and the metallic insertion layer has a work function higher than that of the p-type semiconductor region.

10. The semiconductor device of the claim 9, wherein the metallic insertion layer includes at least one element selected from Au, Pt, Pd, Ni, and Co.

11. The semiconductor device of the claim 1, wherein the gate insulating layer has a thickness of about 6.5 nm or less.

12. The semiconductor device of the claim 1, wherein the plurality of recess regions includes a first recess region, a second recess region, and a third recess region,
   wherein the plurality of semiconductor regions includes a) a first semiconductor region disposed between the first and second recess regions and b) a second semiconductor region disposed between the second and third recess regions,
   wherein a first recess gate is provided in the first recess region, a second recess gate is provided in the second recess region, and a third recess gate is provided in the third recess region, and
   wherein the first recess gate is a passing gate, and the second and third recess gates are cell gates.

* * * * *